(12) United States Patent
Wang (10) Patent No.: US 8,877,577 B2
(45) Date of Patent: Nov. 4, 2014

(54) SEMICONDUCTOR DEVICE AND MANUFACTURING METHOD THEREOF

(75) Inventor: Xinpeng Wang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 124 days.

(21) Appl. No.: 13/458,363

(22) Filed: Apr. 27, 2012

(65) Prior Publication Data

US 2012/0292674 A1 Nov. 22, 2012

(30) Foreign Application Priority Data

May 20, 2011 (CN) .......................... 2011 1 0131053

(51) Int. Cl.
*H01L 29/78* (2006.01)
*H01L 21/768* (2006.01)
*H01L 29/66* (2006.01)

(52) U.S. Cl.
CPC ..... *H01L 21/76895* (2013.01); *H01L 29/66545* (2013.01); *H01L 21/76816* (2013.01)
USPC ................... 438/197; 257/288; 257/E29.255; 257/E21.409

(58) Field of Classification Search
CPC ... H01L 29/6659; H01L 29/665; H01L 29/78; H01L 29/7833; H01L 29/7843; H01L 29/6656; H01L 21/76897; H01L 21/28518; H01L 21/823807; H01L 29/66545; H01L 21/823475
USPC .......................................... 257/288; 438/197
See application file for complete search history.

(56) References Cited

U.S. PATENT DOCUMENTS

| | | | | |
|---|---|---|---|---|
| 6,653,674 | B2 * | 11/2003 | Quek et al. .................... | 257/288 |
| 2003/0216026 | A1 | 11/2003 | Mukherjee-Roy et al. | |
| 2008/0290421 | A1 * | 11/2008 | Wang et al. .................... | 257/384 |
| 2009/0014796 | A1 | 1/2009 | Liaw | |
| 2009/0278178 | A1 * | 11/2009 | Kawahara et al. ............ | 257/288 |
| 2011/0062502 | A1 * | 3/2011 | Yin et al. ....................... | 257/288 |
| 2011/0210380 | A1 * | 9/2011 | Scheiper et al. .............. | 257/288 |

FOREIGN PATENT DOCUMENTS

| | | |
|---|---|---|
| CN | 101165879 | 4/2008 |
| CN | 101183658 | 5/2008 |
| CN | 101345240 | 1/2009 |

OTHER PUBLICATIONS

Office Action from corresponding Chinese Patent Appl. No. 201110131053.3, dated Jun. 4, 2014.

* cited by examiner

*Primary Examiner* — Steven Loke
*Assistant Examiner* — Jonathan Han
(74) *Attorney, Agent, or Firm* — Koppel, Patrick, Heybl & Philpott; Michael J. Ram (57) ABSTRACT

A semiconductor device and method for manufacturing the same are provided. A substrate with an active area and a first interlayer dielectric formed over the substrate is provided. The first interlayer dielectric has a first opening exposing a portion of a surface of the active area, the first opening being filled with a fill material. A second interlayer dielectric is formed over the first interlayer dielectric with a second opening substantially exposing an upper portion of the fill material in the corresponding first opening. The fill material is then removed and the first opening and the second opening are filled with a conductive material to form a contact.

12 Claims, 6 Drawing Sheets

SEMICONDUCTOR DEVICE AND MANUFACTURING METHOD THEREOF

CROSS-REFERENCE TO RELATED APPLICATIONS

This application claims priority to Chinese Patent Application No. 201110131053.3, filed on May 20, 2011 and entitled "Semiconductor Device and Manufacturing Method Thereof", which is incorporated herein in its entirety by reference.

BACKGROUND

1. Field of the Invention

The present invention relates to semiconductor techniques, and more particularly to semiconductor devices and manufacturing method therefore.

2. Description of the Related Art

As part of the development of semiconductor techniques, the critical dimension (CD) of a contact has been greatly reduced especially for current logic devices.

As known by those skilled in the art, there are gate-last approaches and gate-first approaches for field-effect transistor manufacturing process.

Figure 15:
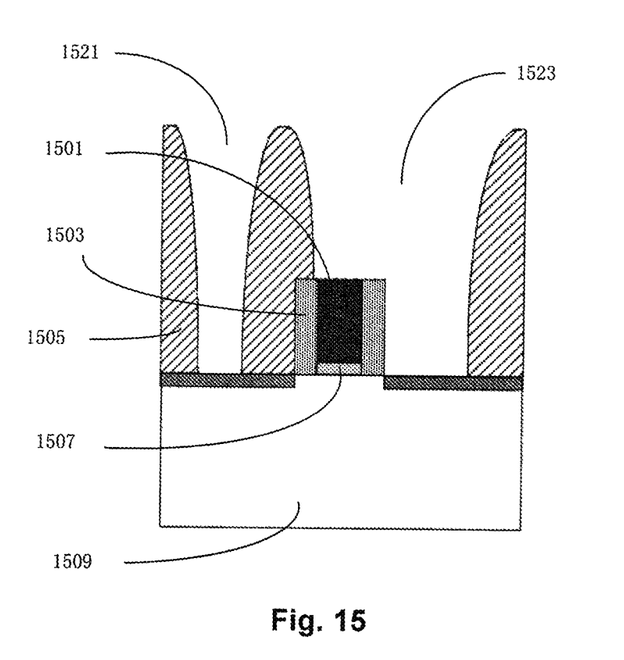
FIG. 15 is a diagram showing a prior art semiconductor device.

Referring to FIG. 15, in the gate-last approach, a dielectric layer 1507 is formed on a substrate 1509, and a dummy gate is formed on the dielectric layer 1507. Preferably, a lightly doped region (LDD) implantation is carried out thereon, and then a spacer 1503 is formed on the sidewalls of the dummy gate 1501. After the formation of a gate structure with the dummy gate as described above, source region and drain region implantations are carried out, and a first dielectric interlayer 1505 is then formed and a chemical-mechanical polishing (CMP) process is performed, so as to substantially expose the upper surface of the dummy gate. The dummy gate is then removed. The dielectric layer 1507 can also be removed in some cases. Thereafter, a gate dielectric layer and a metal gate are formed, for example, by depositing a gate dielectric (in some instances, it may be a high-K dielectric) and then metal gate materials are deposited, followed by a CMP process, so as to form a metal gate 1501 where the dummy gate was previously formed. Then, the interlayer dielectric is re-coated so as to cover the gate. A contact hole 1521, 1523 is subsequently formed. And example of the resultant structure is shown in FIG. 15.

Similarly, the gate-first approach is similar to the conventional method of forming poly-silicon gate devices. A dielectric layer 1507 and gate 1501 are formed on a substrate 1509. Preferably, an LDD implantation is carried out and then a spacer 1503 is formed. After the formation of the gate structure as described above, source region and drain region implantations are carried out. A contact etch stop layer of silicon nitride and a first interlayer dielectric 1505 is formed covering the gate and then a contact hole 1521, 1523 is formed. The resultant structure, which is the same as in the gate-test approach is also as shown in FIG. 15.

Generally, covering the gate with the first interlayer dielectric is mainly to facilitate the formation of contact holes 1521 and 1523 to the gate and/or the active area, which contact holes are used for forming contact or wiring.

However, with the reduction in the size of contact critical dimension, the manufacturing process includes challenges, and open contact risk is also increased. For example, due to the reduction of contact critical dimension, a relatively thick resist may cause the etching of a contact hole (or, an opening) stop. Moreover, it is difficult to scale the contact CD down to a desired target value.

Further, for a contact hole shared by a contact to the active area and a contact to the gate, an open circuit problem may be encountered. Due to a thick resist or overlay variation, a poor connection between the active area and the gate can occur. Besides, the spacer may be etched, leading to an increased leakage from the top of the gate.

In addition, the aspect ratio is too high for a metal CVD (chemical vapour deposition) process to form the contact. As a result, it is difficult to properly control the resistance of the contact to be consistent with the designed or desired resistance. Also, the interlayer dielectric deposition has a small process window, which may result in voids.

Therefore, there exists a need to mitigate or address the above problems. To this end, a novel and creative method as proposed for manufacturing semiconductor devices, so as to mitigate or eliminate one or more problems existed in the prior art.

SUMMARY

In one embodiment of the present invention a method for manufacturing a semiconductor device comprises: providing a substrate with an active area and a first interlayer dielectric formed on the substrate. The first interlayer dielectric has a first opening penetrating through the first interlayer dielectric to expose a portion of the surface of the active area. The first opening is filled with a fill material, that can be selectively removed with respect to the material of the first interlayer dielectric. A second interlayer dielectric is formed over the first interlayer dielectric, the second interlayer dielectric having a second opening penetrating through the second interlayer dielectric layer so as to substantially expose an upper portion of the fill material in the corresponding first opening. The fill material is then removed and the first opening and the second opening are filled with a conductive material to form a contact. The exposed portion of the surface of the active area can be formed with silicide.

The substrate can further comprise a gate structure including a gate over the active area, wherein an upper surface of the gate is substantially flush with an upper surface of the first interlayer dielectric layer.

The gate structure can further comprises a gate dielectric layer below the gate with spacers on both sides of the gate, wherein the gate is a metal gate or a poly-silicon gate.

The exposed surface of the active area can be located in a source region and/or a drain region in the semiconductor device. The exposed surface can includes a silicide.

Filling the first opening can comprise applying a fill material onto the substrate to fill at least the first opening and then removing the fill material such that the fill material remains only in the first opening.

The fill material can be amorphous carbon or a photosensitive material.

The photosensitive material can be a resist or polypropylene.

Removing the fill material can comprise performing an oxygen-involved dry etching or ashing.

At least one of the second openings can be formed to substantially expose an upper portion of the fill material in the first opening. At least some opening holes have a portion of a bottom surface on the gate. The second interlayer dielectric can be formed to further have a third opening only to the gate and the filling also fills the third opening to form a contact to the gate.

The lateral size of the second opening can be larger than or equal to that of the first opening.

The material of the first interlayer dielectric can be the same as or different from that of the second interlayer dielectric.

An object of one embodiment of the present invention is to provide a semiconductor device, comprising a substrate with an active area; a first interlayer dielectric on the active area, the first interlayer dielectric having a first opening penetrating through the first interlayer dielectric to expose a portion of a surface of the active area. A fill material capable of being selectively removed with respect to the material of the first interlayer dielectric fills in the first opening. A second interlayer dielectric covers the first interlayer dielectric and the first opening which is filled with the fill material. The exposed portion of the surface of the active area can be formed with a silicide.

The substrate can further comprise a gate structure including a gate over the active area wherein an upper surface of the gate is substantially flush with an upper surface of the first interlayer dielectric.

The gate structure can further comprise a gate dielectric layer below the gate and a spacer at both sides of the gate, wherein the gate is a metal gate or a poly-silicon gate.

The exposed surface of the active area can be located in a source region and/or a drain region in the semiconductor device and the exposed surface can be formed with a silicide.

The fill material can be amorphous carbon or photo-sensitive material.

The second interlayer dielectric can have has a second opening penetrating through the second interlayer dielectric so as to substantially expose an upper portion of the fill material in the first opening.

The second interlayer dielectric can have has a second opening penetrating through so as to substantially expose an upper portion of the fill material in the first opening and at least a portion of an upper surface of one or more gates.

The second interlayer dielectric can have a third opening only to the gate which is adaptable to be filled with a conductive material to form a contact to the gate.

A lateral size of the second opening can be larger than or equal to that of the first opening.

The material of the first interlayer dielectric can be the same as or different from that of the second interlayer dielectric.

The first opening and the second opening can be adaptable for being filling with a conductive material so as to form a contact.

According to the solutions set forth herein, technical benefits as set forth below can be at least partly achieved. The contact CD can be easily reduced to a desired target value. The contact resistance can be well controlled to be consistent with the designed or calculated result by the straight profile of the contact. A desirable process window for interlayer dielectric deposition can be obtained. The void issue can be mitigated or addressed. The aspect ratio can be reduced such that the metal deposition process for contact can be simplified. The spacer will not be substantially etched or damaged such that leakage from the top of the gate can be reduced.

The embodiments of the present invention are particularly useful in manufacturing advanced semiconductors (such as, logic devices or manufacturing process optimized for logic devices), but the present disclosure is not to be limited thereto and the present embodiments are applicable to extended applications.

Further features and advantages of the present embodiments incorporating features of the invention will become apparent from the following detailed description of exemplary embodiments set forth herein with reference to the attached drawings.

BRIEF DESCRIPTION OF THE DRAWINGS

The accompanying drawings, which are incorporated in the specification together with the description, serve to explain the principles of embodiments of the invention. The present invention will be better understood from the following detailed description of embodiments with reference to the attached drawings, in which.

It should be understood that these drawings are merely illustrative and exemplary in nature, and not intended to limit the scope of the present disclosure. In the drawings, elements are not drawn scale or according to their actual shapes and some of the elements (such as, layers or parts) may be enlarged relative to others so as to more clearly illustrate the principles of the present invention. Moreover, those details that may obscure the gist of the present invention are not shown in the drawings.

DESCRIPTION OF THE EMBODIMENTS

The embodiments of the present disclosure are described below in conjunction with the drawings.

First Embodiment

The first embodiment of the present disclosure is described below with reference to FIGS. 1-7.

Figure 1:
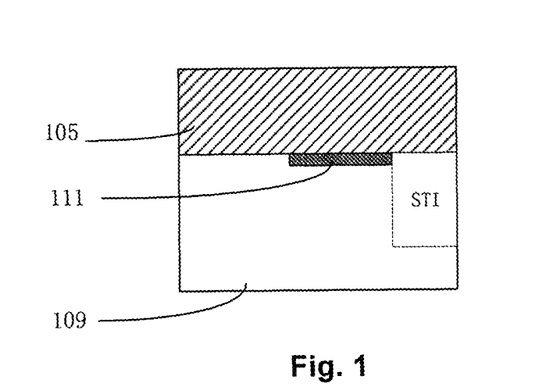
FIGS. 1-7 are diagrams showing steps of a method for manufacturing a semiconductor device according to a first embodiment of the present invention.

A substrate 109 is provided according to the first embodiment of the present disclosure as shown in FIG. 1. The substrate 109 has an active area (not shown), for example, being separated by a shallow trench isolator (STI). Preferably, the surface of the active area over which a contact is to be formed can be formed with a silicide layer 111, so as to reduce contact resistance. A first interlayer dielectric 105 is formed over the active area.

Figure 2:
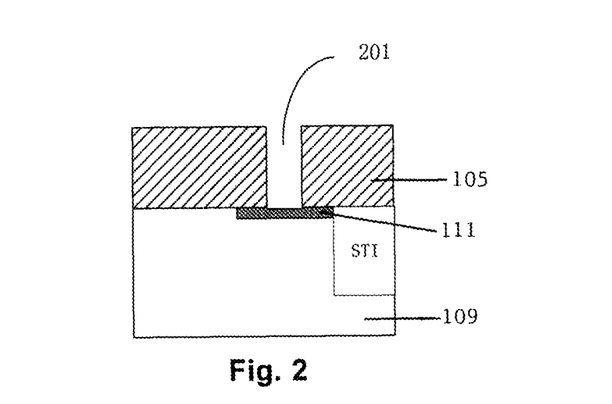

A first opening 201 is formed penetrating through the first interlayer dielectric 105 so that a portion of a surface of the active area, which portion is formed with silicide in some embodiments, is exposed, as shown in FIG. 2. In such a case, the etching to form the first opening can be stopped on the silicide. On the other hand, in some implementations, the step of forming the opening 201 (from example, by etching) may lead to some loss of the silicide layer, as shown in FIG. 2. As such, a first interlayer dielectric 105 with the first opening 201 is formed over the substrate 109.

As would be appreciated by one skilled in the art, the method of forming a first interlayer dielectric 105 having the first opening 201 is not limited to the described process. For example, depending on different applications, a patterned first interlayer dielectric 105 (for example, having a first opening 201) may be formed over the substrate 109 by means of other techniques such as droplet discharging method or printing method (such as, screen printing method), or the like.

In addition, in some implementations, the exposed surface of the active area can be located in a source region and/or a drain region in the semiconductor device (such as a field effect transistor). In other implementations, it is not so limited. For example, the active area can be in the base region, the collector region, and/or the emitter region of a bipolar transistor (as for BJT or biCMOS device, etc.), or over a capacitor region, or the like. Similarly, the exposed surface can also be formed with a silicide.

Figure 3:
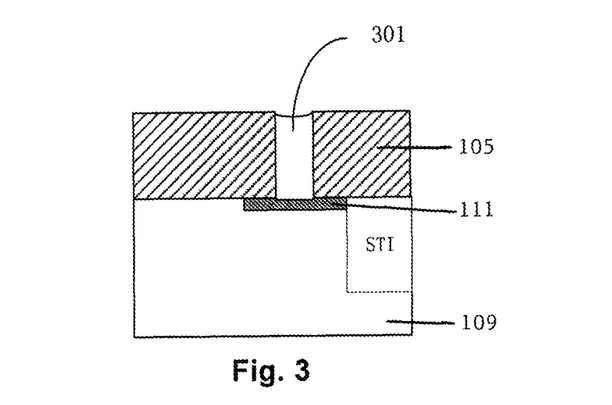

Next, the first opening 201 is filled with a fill material to form a filler 301, as shown in FIG. 3. According to a specific implementation, the fill material can be an Advanced Patterning Film (abbreviated as APF) material, which may be, for example, an amorphous (non-crystalline) carbon. The APF technology is commercially available from Advanced Material, Co. In the prior art, the APF is generally used for forming a patterned film. However, in the present embodiment, APF is used for filling an opening. According to another particular implementation, the fill material can be a photo-sensitive material (or, a light-modifiable material), such as photo resist, polypropylene (PV) or the like. There is no specific limit to the fill material as long as it can fill the opening and can be selectively removed with respect to the material of the first interlayer dielectric.

According to different implementations of the present invention, the step of filling the first opening with a fill material can comprise: applying the fill material onto the substrate such that the first opening is filled with the fill material; and partly removing the fill material such that only the fill material in the first opening is remained.

In the case where the fill material is an APF material, the step of filling can comprise applying the APF material onto the substrate (for example, by depositing) such that the first opening is filled with the APF material and removing unnecessary APF material other than that in the first opening. In some examples of the present disclosure, the APF material can be applied in multiple steps to fill the first opening. For example, a portion of the first opening is filled at each of the multiple steps such that the surface of the APF layer obtained can be approximately flat. In other examples, however, the APF material can be applied once to fill the first opening.

As for removing the APF, unnecessary APF can be removed by dry etching (or ashing), for example, by using various etchant gases such as $O_2$, $SO_2$, $CO_2$, $N_2$, or $H_2$ to remove APF. However, the method of removing APF is not so limited, and one skilled in the related art can take other suitable techniques for removing APF as needed.

In the case where the fill material is a photosensitive material, the step of filling can comprise applying the photosensitive material onto the substrate (such as, by spin-coating, spray-coating, or the like) so that the first opening is filled with the photosensitive material; and removing unnecessary photosensitive material other than that in the first opening. For example, similar to the applying of APF material, the photosensitive material can be applied in multiple steps so as to fill the first opening, such that the surface of the photosensitive material layer obtained can be approximately flat. Then, unnecessary photosensitive materials over the surface of the substrate can be removed by dry etching (or ashing). Alternatively, the photosensitive material can be removed by exposing the applied photosensitive material with a reticle plate so as to modify the photosensitive material overlying the substrate but outside the first opening and removing the modified photosensitive material by using a solution or the like.

Those skilled in the art will readily understand there are various suitable methods for selectively removing different fill materials.

In addition, although the upper surface of the filler 301 is shown as slightly lower than the upper surface of the first interlayer dielectric 105 in the figures, it is merely illustrative in nature and there is no specific limit on the upper surface of the filler. For example, the upper surface of the filler 301 can be flush with, or slightly higher or lower than the upper surface of the first interlayer dielectric 105 or, the upper surface of the filler 301 may protrude from the upper surface of the first interlayer dielectric 105.

After the formation of the filler 301, a second interlayer dielectric 401 having a second opening 501 is formed, wherein, the second opening substantially exposes an upper portion of the fill material (filler 301) in the first opening 201.

Figure 4:
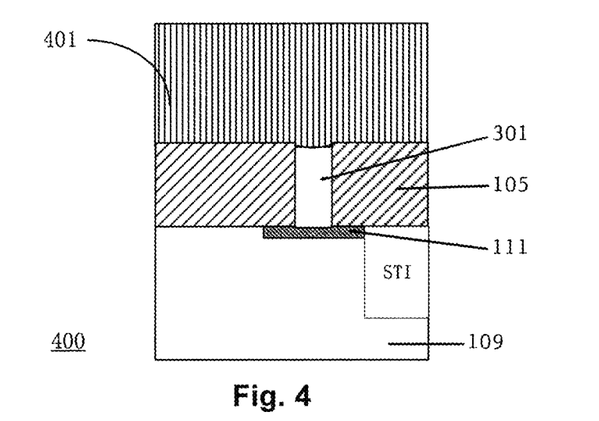
Figure 5:
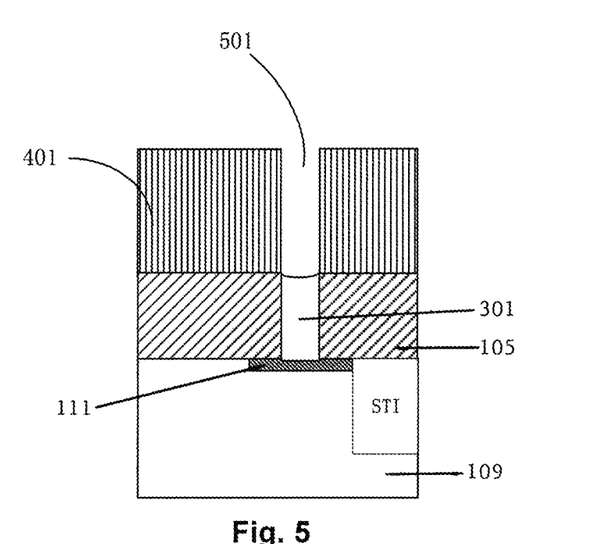

In a particular embodiment of the present invention, the step of forming a second interlayer dielectric layer 401 having a second opening comprises depositing a second interlayer dielectric material to cover the first interlayer dielectric 105 and the fill material (filler 301) in the first opening 201, as shown in FIG. 4; and patterning the second interlayer dielectric 401 to form a second opening 501, the second opening substantially exposing an upper portion of the fill material (filler 301) in the first opening 201, as shown in FIG. 5. In an example of this embodiment, the patterning can comprise forming a mask (such as a hard mask or a resist) over the second interlayer dielectric 401, and etching the second interlayer dielectric 401 using the mask so as to form a second opening. Preferably, an etch stop layer (not shown) may be formed before depositing the second interlayer dielectric 401.

Similarly, the method of forming a second interlayer dielectric having a second opening is not so limited. For example, depending on different applications, a patterned second interlayer dielectric 401 (for example, having second open (s)) may be formed over the substrate (including the first interlayer dielectric 105 and a filler 301) by means of a droplet discharge method or printing method (such as, screen printing method), or the like. In such an instance, the upper surface of the gate can be made substantially flush with the upper surface of the first interlayer dielectric, for example, by controlling the thickness of the layers.

Here, the material of the second interlayer dielectric 401 can be the same as or different from that of the first interlayer dielectric 105. In addition, preferably, the lateral size of the second opening can be larger than or equal to that of the first opening.

Figure 6:
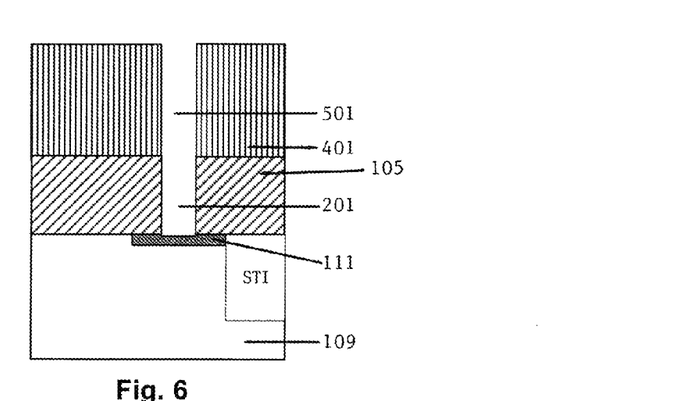

Next, the fill material (filler 301) is removed, as shown in FIG. 6. In some embodiments, preferably, the fill material may be removed by procedures such as dry etching or ashing process. The dry etching may be, for example, an oxygen-involved dry etching. However, the present disclosure is not so limited. For example, a fluorine-involved dry etching may be adopted. Moreover, if a photo-sensitive material (such as, photosensitive resist or polypropylene) is used as the fill material, a wet etching (for example, by using a solvent) may be employed for removing the fill material, in addition to the dry etching and ashing techniques described above.

Figure 7:
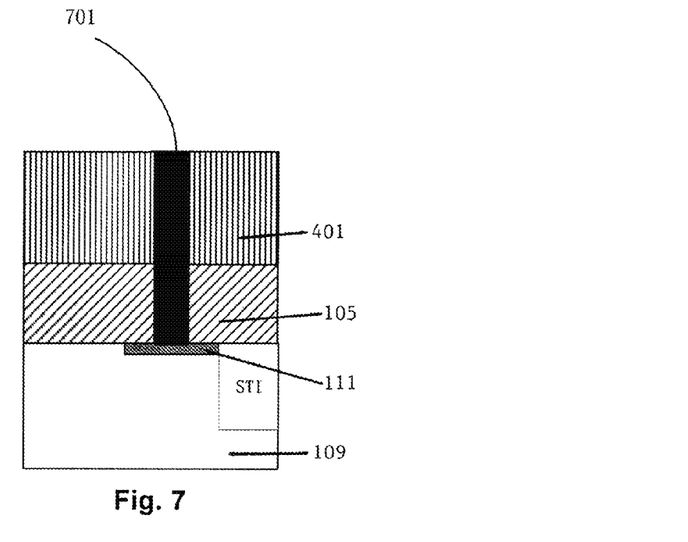

Thereafter, the first opening and the second opening are filled with a conductive material to form a contact 701, as shown in FIG. 7. In a particular example, as would be appreciated by one skilled in the art, filling the first opening and the second opening with a conductive material typically can comprise depositing the conductive material onto the substrate and performing chemical mechanical polishing, for example, such that in the resultant structure, the upper surface of the contact is substantially flush with the upper surface of the second interlayer dielectric 401. There are no particular limits on the conductive material, and for example, the conductive material can be selected from tungsten (W), gold (Au), silver (Ag), rhodium (Rh), iridium (Ir), and copper (W), or an alloy or a stack of these elements and/or other elements.

The first embodiment of the present disclosure has been described above with reference to FIGS. 1-7.

Second Embodiment

A second embodiment of the present disclosure is described below with reference to FIGS. 8-14. Although the second embodiment disclosed herein preferably is applicable to advanced semiconductor manufacturing process, one skilled in the art should appreciate that the application of this embodiment is not so limited. Obviously, various concepts of the disclosed herein can be adaptively applied to various semiconductor manufacturing processes.

In the second embodiment, components that are like those described in the first embodiment are indicated with the same reference numbers, and detailed descriptions and forming processes thereof disclosed as to the first embodiment can be used in the second embodiment.

FIGS. 8-14 are diagrams showing steps of a method for forming a semiconductor device according to the second embodiment of the present disclosure, which basically corresponding to FIGS. 1-7, respectively. Differences between FIGS. 8-14 and FIGS. 1-7 are described in detail as follows.

Figure 8:
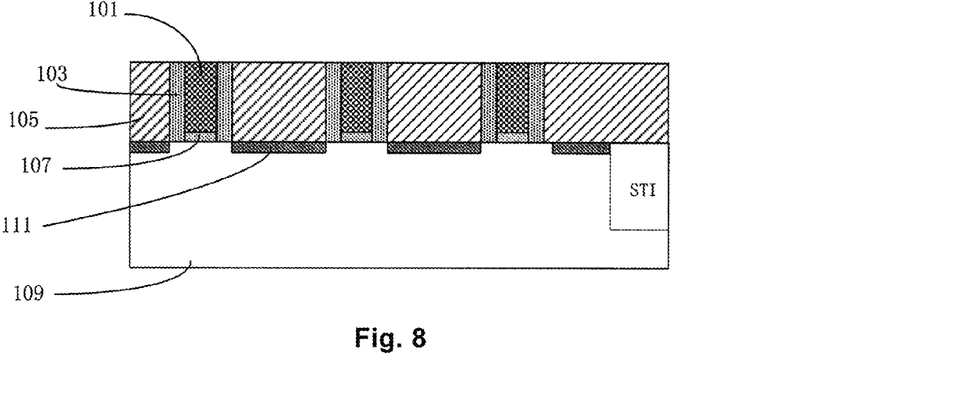
FIGS. 8-14 are diagrams showing steps of a method for manufacturing a semiconductor device according to a second embodiment of the present invention.

A substrate 109, provided according to the second embodiment of the present disclosure, is shown in FIG. 8. Compared to the substrate shown in FIG. 1, the substrate 109 further comprises multiple gate structures with a gate 101, over the active area of the substrate 109. A first interlayer dielectric 105 is formed over the active area.

Preferably, the gate structure further comprises a dielectric layer 107 below the gate 101 and a spacer 103 along the sides of the gate. In some particular implementations of this embodiment, the gate 101 can be a metal gate or a poly-silicon gate, and the dielectric layer 107 can individually serve as a gate dielectric layer. In other implementations, however, the gate 101 can be a dummy gate (for example, being formed of but not limited to polycrystalline silicon), which will be removed in a later step. In such case, depending on different designs and process flows, the dielectric layer 107 can be removed, or may serve as a part of the gate dielectric in the final device. Moreover, in some embodiments, as shown in FIG. 8, the first interlayer dielectric layer can be formed at both sides of the gate structure adjacent to the source region and the drain region. However, the present embodiment is not limited thereto.

In a preferred implementation of this embodiment, an upper surface of the gate 101 is substantially flush with an upper surface of the first interlayer dielectric 105, as shown in FIG. 8. In some examples of the present embodiment, a chemical mechanical polishing procedure can be performed on the substrate 109 including the gate structure and the first interlayer dielectric 105 as described above, such that the upper surface of the gate 101 is substantially flush with the upper surface of the first interlayer dielectric 105.

For example, for the gate-first approach (such as for the use of a metal gate or a poly-silicon gate), chemical mechanical polishing (CMP) is performed after the formation of the first interlayer dielectric 105 to expose an upper surface of the gate 101. As such, the upper surface of the gate 101 is substantially flush with the upper surface of the first interlayer dielectric 105. For example, the CMP that exposes the upper surface of the gate 101 can be triggered to stop or can be stopped by timing.

For the gate-last approach, however, after the metal gate CMP, re-coating of the interlayer dielectric is not performed, such that the upper surface of the gate is substantially flush with the upper surface of the first interlayer dielectric.

In such a manner, it is possible to make the upper surface of the gate 101 to be substantially flush with the upper surface of the first interlayer dielectric 105. Those skilled in the art would appreciate that it may be difficult to avoid process variations or offsets which may be inevitable. Thus, the expression "flush with" used herein incorporates "substantially flush with", and these two expressions can be used interchangeably throughout the specification and both refer to being "flush" taking into account process variations or offsets. As such, as used herein, the expression "flush with" or "substantially flush with" means that the surfaces may in fact not be flush with.

Figure 9:
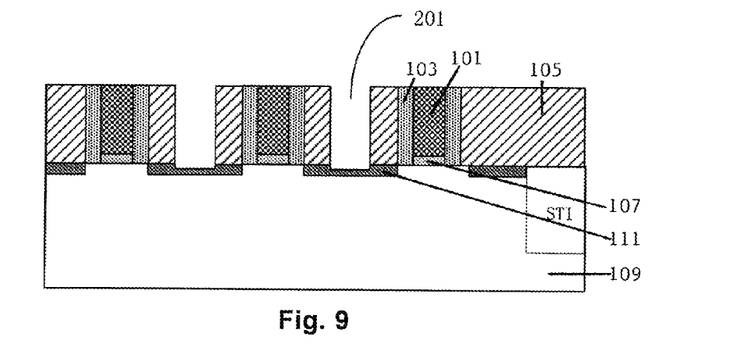

A first opening 201 is formed penetrating through the first interlayer dielectric 105 so that a portion of a surface of the active area, which portion can be formed with silicide in some embodiments, is exposed, as shown in FIG. 9. In such a case, the etching for forming the first opening can be stopped on the silicide. However, the method of forming a first interlayer dielectric having a first opening is not so limited. For example, depending on different applications, a patterned first interlayer dielectric having a second opening may be formed over the substrate by a droplet discharging method or printing method (such as, screen printing method), or the like. In some implementations, the exposed surface of the active area can be located in a source region and/or a drain region (for example, corresponding to the gate structure) in the semiconductor device. In addition, a portion of the surface of the active area on which a contact is to be formed, can include a silicide layer (for example, silicide layer 111), so as to reduce contact resistance. That is, the portion of the surface of the active area exposed through the opening 201 may be formed with silicide in some embodiments.

Figure 10:
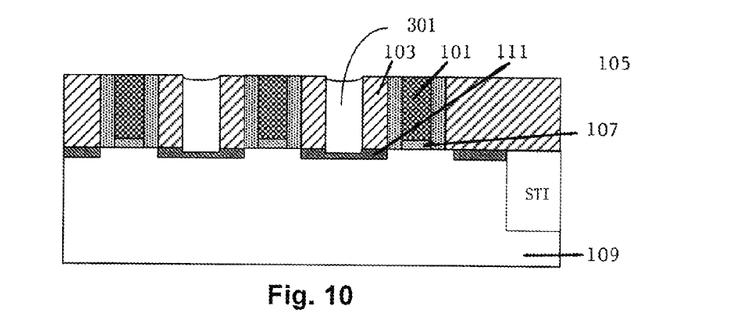

Next, the first opening 201 is filled with a fill material so as to form a filler 301, as shown in FIG. 10.

Figure 11:
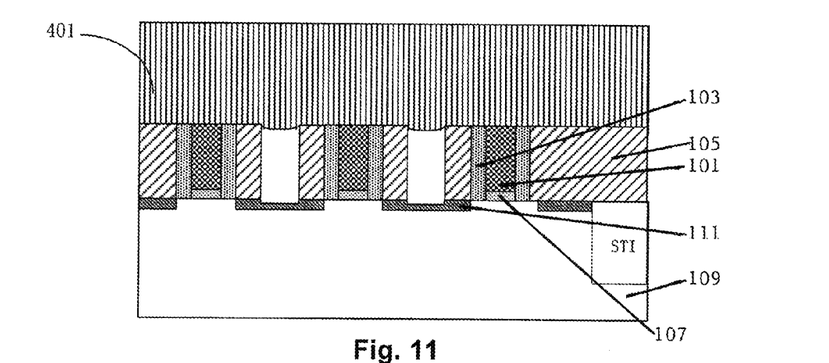
Figure 12:
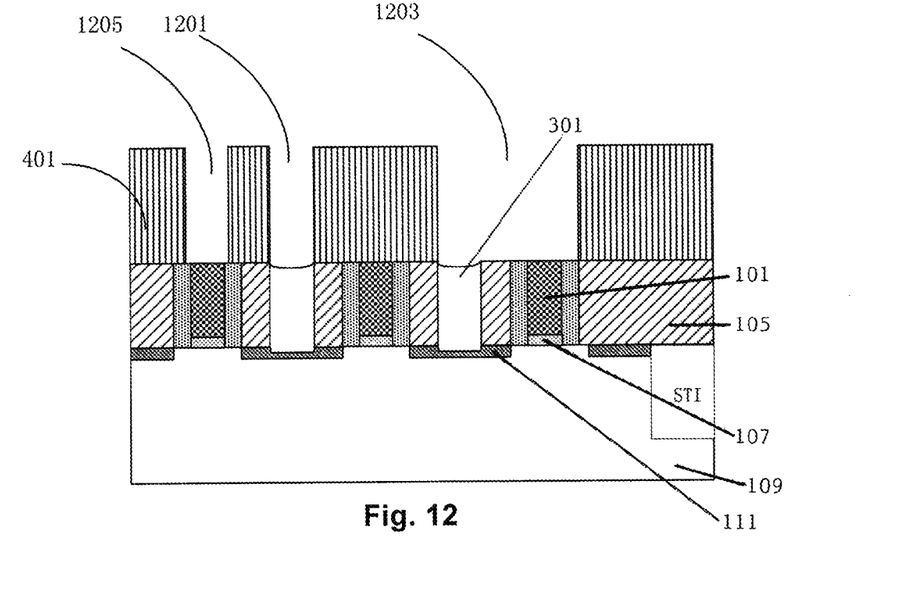

After the formation of the filler 301, a second interlayer dielectric 401 having second opening(s) (1201 and/or 1203) is formed. In a more particular implementation of the present disclosure, the step of forming a second interlayer dielectric 401 having second openings can comprise depositing a dielectric material to form a second interlayer dielectric 401 that covers the first interlayer dielectric 105 and the fill material (filler 301) in the first opening 201, as shown in FIG. 11. The second interlayer dielectric 401 can be patterned to form second opening(s) 1201 and/or 1203, the second opening(s) substantially exposing an upper portion of the fill material (filler 301) in the first opening 201, as shown in FIG. 12. Likewise, preferably, an etch stop layer (not shown) may be formed before depositing the second interlayer dielectric 401.

As described above, the method of forming a second interlayer dielectric having second opening 1201, 1203 is not so limited. For example, depending on different applications, a patterned second interlayer dielectric 401 (for example, having the second opening(s) 201, 205) can formed over the substrate 109 (including the first interlayer dielectric 105 and the filler 301) by droplet discharging method or printing method (such as, screen printing method), or the like.

The second opening 1201 can substantially expose an upper portion of the fill material (filler 301) in the first opening 201. The second opening 1203 can substantially expose an upper portion of the fill material (filler 301) in the first opening 201 and at least a portion of an upper surface of one or more gates 101.

The material of the second interlayer dielectric 401 can be the same as or different from that of the first interlayer dielectric 105. In addition, preferably, the lateral size of the second openings 1201 and 1203 can be larger than or equal to that of the first opening 201.

Figure 13:
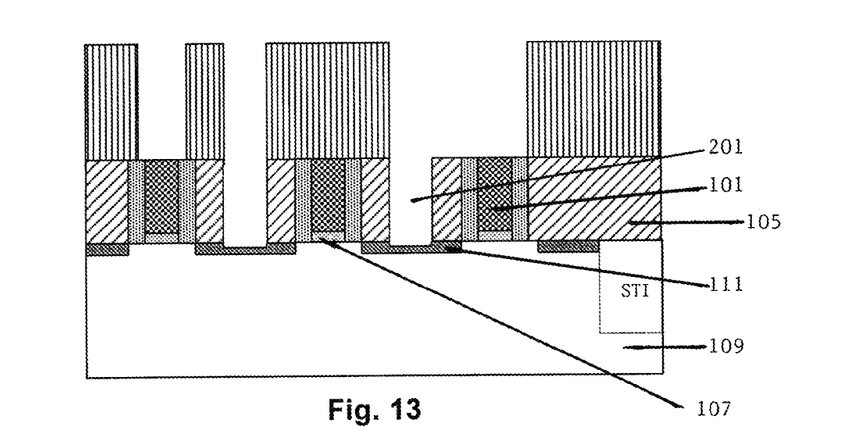

Next, the fill material (filler 301) is removed, as shown in FIG. 13. In some implementations, preferably, the fill material can be removed by procedures such as dry etching or ashing. However, as described above, the present disclosure is not so limited.

Figure 14:
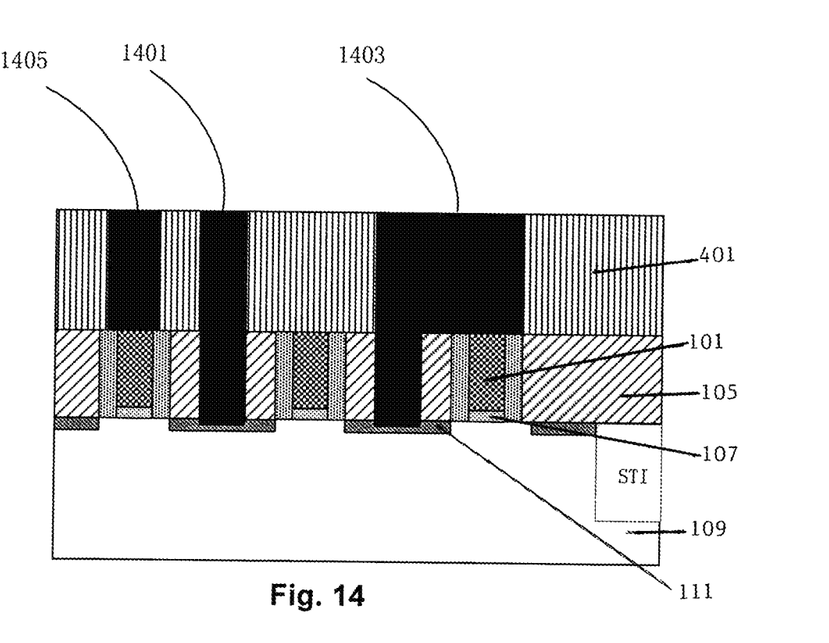

Thereafter, the first opening 201 and the second opening(s) 1201, 1203 are filled with a conductive material, so as to form contact (s) 1401, 1403, 1405 as shown in FIG. 14.

In a particular example of the second embodiment, as shown in FIG. 12, the second interlayer dielectric 401 may further have an opening 1205 only to the gate such that a contact 1405 to the gate 101 is formed through this opening 1205 (see FIG. 14).

The second embodiment of the present disclosure has been described above with reference to FIGS. 8-14. A third embodiment of the present disclosure will be described below with reference to the drawings.

Third Embodiment

According to an example of a third embodiment of the present disclosure, a semiconductor device 400 is provided, as shown in FIG. 4, which comprises a substrate 109 with an active area (not shown); a first interlayer dielectric 105 over the active area, the first interlayer dielectric 105 having a first opening 201 penetrating through the first interlayer dielectric 105 to expose a portion of a surface of the active area. A fill material (filler 301) fills in the first opening 201, the fill material being capable of being selectively removed with respect to the material of the first interlayer dielectric 105. A second interlayer dielectric 401 covers the first interlayer dielectric 105 and the first opening 201 that is filled with the fill material 301.

According to another example of the third embodiment, the substrate further comprises a gate structure including a gate 101, over the active area, wherein the upper surface of the gate is substantially flush with the upper surface of the first interlayer dielectric 105, as shown in FIG. 11. Preferably, the gate structure includes a gate dielectric layer 107 below the gate 101 and a spacer at both sides of the gate. Preferably, the gate 101 is a metal gate or a poly-silicon gate.

According to a further example of the third embodiment, the exposed surface of the active area is located in a source region and/or a drain region in the semiconductor device. Preferably, a silicide layer 111 is formed over a surface of the active area on which a contact is to be formed.

According to an example of the third embodiment, the fill material can be amorphous carbon, photosensitive material or, light-modifiable material.

According to one example of the third embodiment, a second opening 501 penetrating through the second interlayer dielectric 401 can be formed, wherein, the second opening 1201 substantially exposes an upper portion of the fill material 301 in the first opening 201.

According to one example of the third embodiment, the second interlayer dielectric has a second opening 1203 penetrating through the second interlayer dielectric 401 such that an upper portion of the fill 301 in the first opening 201 and at least a portion of an upper surface of one or more gates 111 are exposed.

In another example, a second opening 1205 may be formed in the second interlayer dielectric 401 such that only an upper surface of the gate 101 is exposed.

According to a further example of the third embodiment, the lateral size of the second opening 1201, 1203 is larger than or equal to that of the first opening 201.

According to an example of the third embodiment, the first interlayer dielectric material is the same as or different from that of the second interlayer dielectric.

According to an example of the third embodiment, the first opening 201 and the second openings 1201, 1203, 1205 are adaptable for being filled with a conductive material 1401, 1403, 1405 so as to form a contact.

The embodiments of the present disclosure have been described above with reference to the drawings. It should be appreciated that these embodiments are merely illustrative in nature and not intended to limit the claims hereof. These embodiments can be arbitrarily combined with each other without departing from the scope of the present disclosure. In addition, the embodiments and details of the present disclosure can be modified by those skilled in the art in light of the teachings herein, without departing from the scope of the present disclosure. Therefore, all these modifications are embraced within the spirit and scope of the present disclosure as defined by the attached claims.

What is claimed is:

1. A method for manufacturing a semiconductor device comprising:
    providing a substrate with an active area and a first interlayer dielectric formed over the substrate, the first interlayer dielectric having a first opening penetrating through the first interlayer dielectric so as to expose a portion of a surface of the active area;
    filling the first opening with a fill material, wherein, the fill material can be selectively removed with respect to the material of the first interlayer dielectric;
    forming a second interlayer dielectric over the first interlayer dielectric, the second interlayer dielectric having a second opening penetrating through the second interlayer dielectric so as to substantially expose an upper portion of the fill material in the corresponding first opening;
    removing the fill material; and
    filling the first opening and the second opening with a conductive material so as to form a contact.

2. The method according to claim 1, wherein the substrate further comprises a gate structure including a gate over the active area, wherein an upper surface of the gate is substantially flush with an upper surface of the first interlayer dielectric.

3. The method according to claim 2, wherein the gate structure further comprises a gate dielectric layer below the gate and spacers on both sides of the gate,
    wherein the gate is a metal gate or a poly-silicon gate.

4. The method according to claim 1, wherein the exposed surface of the active area is located in a source region or a drain region in the semiconductor device.

5. The method according to claim 1, wherein filling the first opening with a fill material comprises:
    applying the fill material onto the substrate to fill the first opening; and
    removing a portion of the fill material such that only the fill material in the first opening remains.

6. The method according to claim 1, wherein the fill material is amorphous carbon or a photo-sensitive material.

7. The method according to claim 6, wherein the photosensitive material is a resist or polypropylene.

8. The method according to claim 1, wherein removing of the fill material comprises:
    performing a dry etching with an oxygen containing material or ashing to remove the fill material.

9. The method according to claim 2, wherein the second opening substantially exposes the upper portion of the fill material in the first opening and at least a portion of an upper surface of one or more gates.

10. The method according to claim 1, wherein the lateral size of the second opening is larger than or equal to that of the first opening.

11. The method according to claim 1, wherein the exposed portion of the surface of the active area is formed with a silicide.

12. The method according to claim 1, wherein the second interlayer dielectric further has a third opening, said third opening posing only the gate, and wherein the fill material also fills the third opening to form a contact to the gate.

* * * * *